United States Patent
Muller et al.

(10) Patent No.: US 6,645,795 B2
(45) Date of Patent: Nov. 11, 2003

(54) POLYSILICON DOPED TRANSISTOR USING SILICON-ON-INSULATOR AND DOUBLE SILICON-ON-INSULATOR

(75) Inventors: K. Paul Muller, Wappingers Falls, NY (US); Dominic J. Schepis, Wappingers Falls, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 09/848,467

(22) Filed: May 3, 2001

(65) Prior Publication Data

US 2002/0171105 A1 Nov. 21, 2002

(51) Int. Cl.[7] .................. H01L 21/00; H01L 21/22; H01L 21/3205
(52) U.S. Cl. .................. 438/149; 438/163; 438/561; 438/564; 438/585
(58) Field of Search ............... 438/149, 163, 438/164, 558, 564, 561, 585

(56) References Cited

U.S. PATENT DOCUMENTS

| | | | | |
|---|---|---|---|---|
| 5,028,564 A | * | 7/1991 | Chang et al. ............ | 438/564 |
| 5,486,282 A | | 1/1996 | Datta et al. ............. | 205/123 |
| 5,534,094 A | | 7/1996 | Arjavalingam et al. .... | 156/155 |
| 5,580,797 A | * | 12/1996 | Miwa et al. ............. | 438/564 |
| 5,776,823 A | | 7/1998 | Agnello et al. .......... | 438/592 |
| 5,796,166 A | | 8/1998 | Agnello et al. .......... | 257/751 |
| 5,936,278 A | * | 8/1999 | Hu et al. ............... | 257/336 |
| 6,013,936 A | * | 1/2000 | Colt et al. ............. | 257/506 |
| 6,166,412 A | * | 12/2000 | Kim et al. .............. | 257/366 |

FOREIGN PATENT DOCUMENTS

| | | | |
|---|---|---|---|
| JP | 4-180234 | * | 6/1992 |
| JP | 404180234 A | * | 6/1992 |

\* cited by examiner

Primary Examiner—Michael Trinh
(74) Attorney, Agent, or Firm—Whitham, Curtis & Christofferson, P.C.; Jay H. Anderson

(57) ABSTRACT

Steep concentration gradients are achieved in semiconductor device of small sizes formed on SOI or double SOI wafers by using implanted polycrystalline material such as polysilicon as a solid diffusion source. Rapid diffusion of impurities along grain boundaries relative to diffusion rates in monocrystalline materials provides a substantially constant impurity concentration at the interface between polycrystalline material and monocrystalline material. Steepness of the impurity concentration gradient is thus effectively scaled as transistor size is decreased to counter increased short channel and other deleterious effects. In the case of SOI wafers greater uniformity of electrical characteristics are achieved using the high quality of semiconductor material made available therein consistent with the relatively thin active layer. In the case of double SOI, a ground plane is formed under the conduction channel which regulates the geometry of the electric field in the conduction channel with much the same functional improvements as is achieved in dual gate transistor designs.

10 Claims, 5 Drawing Sheets

POLYSILICON DOPED TRANSISTOR USING SILICON-ON-INSULATOR AND DOUBLE SILICON-ON-INSULATOR

BACKGROUND OF THE INVENTION

1. Field of the Invention

The present invention generally relates to field effect transistors suitable for use in high density integrated circuits and, more particularly to field effect transistors of extremely small size with reduced short channel effects formed on silicon-on-insulator (SOI) and double SOI substrates.

2. Description of the Prior Art

The potential for increased performance and functionality of integrated circuits by increased proximity of devices has provided a strong incentive to increase integration density to decrease length of signal propagation paths, and increase the number of devices which can be formed on a single chip of a given size. Reduction of signal path length reduces interconnection resistance and capacitance and allows reduction of signal propagation time as well as susceptibility to capacitive or inductive coupling of noise. Such reductions in interconnect capacitance must also be accompanied by reductions in device dimensions both to reduce parasitic capacitances which reduce switching speed and to allow optimal reduction of interconnect length consistent with suitable dimensions for isolation structures. Accordingly, lithographic techniques have become very sophisticated and can produce minimum feature sizes of a fraction of a micrometer.

In general, while semiconductor processing techniques have been developed to form structures having dimensions much smaller than can be resolved by lithographic exposure techniques, at least one lithographic exposure is necessary to define the location and general dimensions of a device or other structure. However, while some structures can be formed at such small sizes, others cannot and adjustments in operating parameters are often required. In other cases, difficulty in scaling semiconductor structures when seeking to exploit newly developed lithographic capabilities may be the principal limiting factor in the successful reduction of active device dimensions or limit the performance which can be obtained from an active device of a given size at the limit of lithographic resolution. Some active device structures simply do not scale well to smaller sizes.

For example, in field effect transistors, short channel effects which cause leakage and reduction in resistance differential between "on" and "off" states have been recognized for many years as the conduction channel length was reduced in transistor designs. This problem led to the development of lightly doped drain structures, now more generally referred to as extension implants since optimal impurity concentrations can be substantial while the dimensions thereof are generally very small. Also, gate to substrate capacitance has limited performance and led to so-called "halo" implants to increase the impurity concentration gradient in the substrate below the gate structure. Both of these structures require that the impurity concentration be well-controlled and the concentration gradients be very steep, particularly in devices of small size.

In general, impurities are placed in desired locations by implantation which can be controlled to sub-lithographic dimensions by known techniques. However, implantation must be followed by a closely controlled heat treatment or annealing process to repair lattice damage from the implantation and to activate the impurity by incorporation in the lattice structure. Such heat treatment also causes diffusion of the impurity which cannot be avoided and the implant location must often be adjusted to compensate for the diffusion so that the final impurity location will be as intended. The mechanics of diffusion are inherent material properties and are well-understood to depend upon the materials (and the microstructure thereof), temperature, time and impurity concentration gradient. Many state-of-the-art semiconductor structure designs therefore have a heat budget which cannot be exceeded without compromise of the intended electrical properties of the device.

Viewed another way, a given amount of heat treatment required following impurity implantation to repair lattice damage and activate the impurity will inevitably lead to a reduction in the steepness of impurity concentration gradient while decreased size of active semiconductor devices, and field effect transistors, in particular, makes the steepness of impurity concentration gradients much more critical in smaller devices in order to obtain optimal device performance. This can be understood from the fact that a scaling of a transistor to smaller dimensions would require increase in the impurity concentration gradient while that increase in concentration gradient may not be possible or available consistent with annealing after an impurity implantation and other device impurity concentration requirements.

To obtain high performance and consistency of conduction characteristics of transistors formed on a chip or wafer, silicon-on-insulator substrates have been employed in recent years, largely enabled by the extremely high quality of monocrystalline silicon which is produced in a relatively thin surface layer. However, certain electrical characteristics and device structure designs may be complicated by the placement of the high quality surface layer on an insulator which insulates it from the bulk or handling substrate provided to reduce fragility of the wafer or chip. In particular, deep structures may be difficult to form and process windows may be significantly restricted.

SUMMARY OF THE INVENTION

It is therefore an object of the present invention to provide a field effect transistor structure of extremely small size with improved performance and reduced short channel effects on SOI and double SOI wafers and chips.

It is another object of the invention to provide a technique for developing high impurity concentration gradients for halo and extension structures in field effect transistors on SOI and double SOI wafers or chips, particularly when of small size.

It is a further object of the invention to provide high and improved performance of field effect transistors formed at sub-lithographic dimensions on SOI and double SOI wafers or chips.

It is yet another object of the present invention to provide enhanced performance and electrical characteristics similar to dual gate transistors utilizing double SOI.

In order to accomplish these and other objects of the invention, a method of forming a semiconductor device is provided including steps of forming a recess in a monocrystalline layer on an insulator and adjacent a stud defining a transistor location, depositing polycrystalline material in the recess, implanting an impurity in the polycrystalline material, and diffusing the impurity along grain boundaries in the polycrystalline material into said monocrystalline material whereby rapid diffusion in the polysilicon relative to the diffusion in the monocrystalline material forms a steep impurity concentration gradient for halo and/or extension impurity structures.

In accordance with another aspect of the invention, a semiconductor device is provided including sidewalls formed on the interior of an aperture in a polycrystalline semiconductor material and adjacent monocrystalline semiconductor material on an insulator layer underlying the aperture, a gate structure formed within the aperture, and an impurity concentration gradient extending below the gate structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
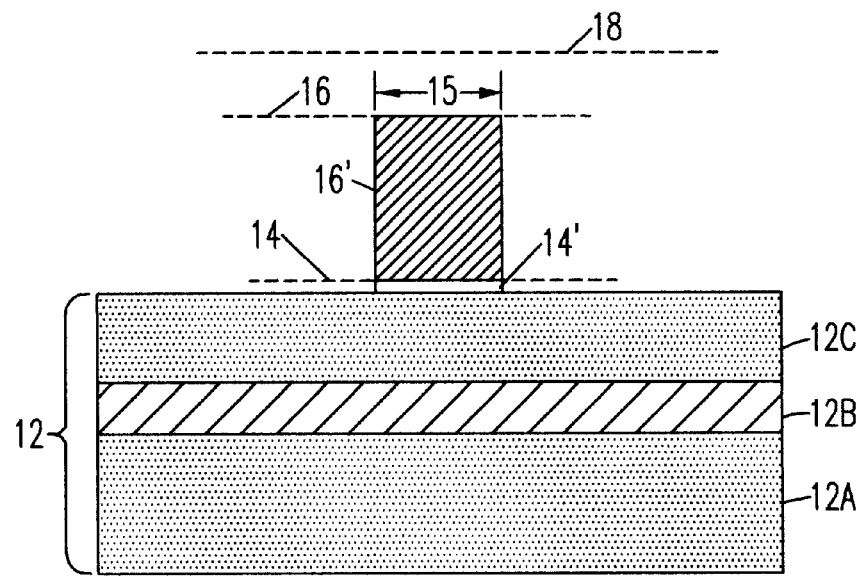
FIG. 1 is a cross-sectional view of an initial stage of fabrication of a transistor on SOI in accordance with the invention.

Referring now to the drawings, and more particularly to FIG. 1, there is shown, in cross-sectional view, an initial stage in the fabrication of a field effect transistor in accordance with the invention. It should be understood that while the invention will be described assuming SOI and double SOI technology, as is currently considered to be preferred for some applications, it is also applicable to other semiconductor materials such as germanium and Group III-V materials and combinations or alloys thereof such as SiGe on insulator. It should also be understood that layer 12 is a composite of three layers depicted as a bulk material or handling substrate 12a, a bottom or buried oxide (or other insulator) layer 12b and an SOI layer 12c.

A thin pad oxide layer 14 is deposited or grown to a thickness of about 8 nm on SOI layer 12c. This pad oxide could be left in the device as a gate oxide but it is preferred to later remove and reform it to increase reliability, uniformity and manufacturing yield, as will be discussed in greater detail below. A thick layer 16 of silicon nitride or other good polish stop for which a selective etchant is known is deposited over the thin oxide 14. The nitride and oxide are then covered with a lithographic resist layer 18 and exposed and patterned to define the gate structure dimensions 14', 16' by any desired lithographic tool and technique appropriate to the size of the transistor to be formed. It should be noted that dimension 15 could be of minimum feature size for any particular lithographic process chosen. Optional fill structures can be added up to the gate level defined by the top of nitride layer 16, preferably prior to gate patterning to form 14' and 16'.

Figure 2:
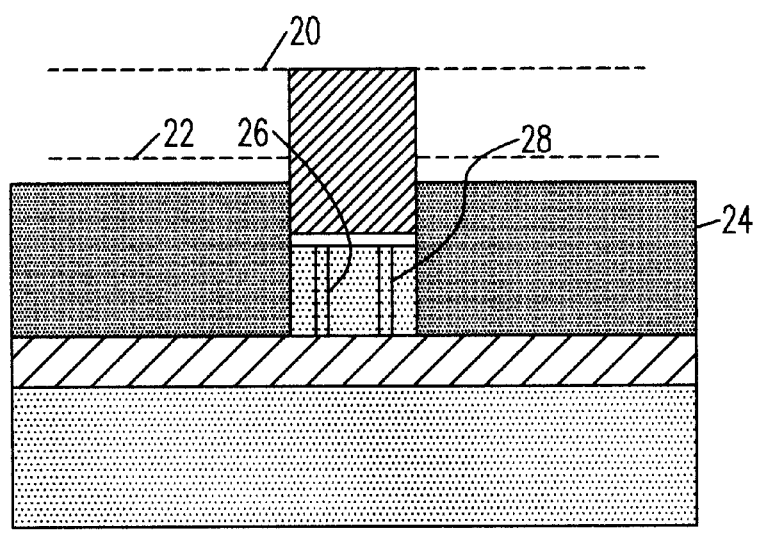
FIGS. 2, 3 and 4 show intermediate stages in the formation of a transistor on SOI in accordance with the invention.

Referring now to FIG. 2, an anisotropic etch of SOI layer 12c is performed, preferably a reactive ion etch (RIE) through the SOI layer 12c or at least a substantial fraction thereof. The nitride stud 16' is used as a mask for this process and the oxide 14' should not be undercut or etched at the edges thereof by the anisotropic process. Polysilicon layer 20 is then deposited by any known process to a thickness of about 200 nm or more depending on the height of the nitride stud 16' above the SOI recess and planarized to the level of the nitride stud 16' by a chemical mechanical polish (CMP) selective to the nitride. The recess provides for shaping of halo and extension impurity structures. The formation of these impurity structures may be done in several stages with separate implants and activation anneals as will be described below.

The chemical mechanical polish (CMP) step removes polysilicon from the top of the nitride and establishes a substantially known thickness for the polysilicon to facilitate regulation of the thickness thereof in later steps. The polysilicon 20 is then recessed by etching selective to nitride to a depth of about 100 nm which may be widely varied in dependence on the desired shape and location of impurity concentrations and gradients. The resulting thickness can be adequately controlled by a timed etch, particularly if the original thickness is accurately known (e.g. from the polishing back to the nitride).

If silicide contacts are to be formed, it is possible to form them at this point in the process by selectively depositing metal such as tungsten, cobalt or nickel in a layer 22 (self-aligned with the nitride stud 16') and annealing the structure to alloy the metal with the recessed polysilicon 24. This process is not important to the successful practice of the invention but, in general, silicide contacts are preferred for deriving the qualities of low resistance and good metal adhesion. Since no impurities have been added to the structure at this point, the annealing cannot compromise distribution thereof. However, the annealing should not significantly diminish the grain boundaries in the polysilicon by causing increase of grain size although some changes to the grain structure of the polysilicon are tolerable and other grain boundaries may be formed during later implantation processes. Therefore, there is a relatively wide process window for silicide formation.

Nevertheless, formation of silicide at this point, while possible, presents difficulty in later implantation processes. Therefore formation of silicide contacts by a process intervening between the halo and extension implant processes and the deposition of thick oxide 30 is currently deemed to be preferable by the inventors.

The invention exploits the recognition that impurities will diffuse much more rapidly (by a factor of about ten or ore) along grain boundaries than through monocrystalline silicon or monocrystalline grain of polysilicon. Therefore, impurities for the halo implant and source/drain extensions can now be implanted, in turn, (again using the nitride as a mask) to a depth close to the bottom of the recessed polysilicon 24 and diffused along the polysilicon grains during a subsequent drive-in anneal process.

Appropriate energy for these implantation processes is determined in a known and well-understood manner in accordance with the known polysilicon thickness to develop a concentration distribution as broad/flat as possible and preferably approximately centered in the thickness of the top polysilicon 12c. When using SOI (and double SOI wafers, as will be described below) it is generally desirable to perform the implants such that the impurity concentration will be substantially constant over the depth of the polysilicon 24. However, this concentration profile can be varied as desired to achieve various desired electrical characteristics as will be apparent to those skilled in the art.

Rapid diffusion along the grain boundaries in the polysilicon, particularly in comparison with diffusion rates in monocrystalline silicon, maintains a nearly constant impurity concentration at the interface of the polysilicon 24 and the remaining transistor region of silicon layer 12c and results in a sharp gradient of impurity concentration to form halo implant 26, particularly over short distances in the monocrystalline silicon. In other words, the more rapid diffusion along grain boundaries provides an enhancement to diffusion even from another type of solid body since a high and substantially constant impurity concentration is maintained at the monocrystalline material surface.

It should be noted that this distance will generally be quite short since it will be a relatively small fraction of distance 15 (FIG. 1) which may be of minimum feature size. (By the same token, while the overall footprint of the transistor is not reduced, the conduction channel length of the transistor is, in fact, reduced to less than dimension 15 and the overall transistor can be completed in just slightly more than the minimum feature size dimension.)

That is, the gradient will, in effect, be scaled to a substantial degree in accordance with the device size for small sizes, particularly for minimum feature size regimes below one micrometer where the diffusion length in monocrystalline silicon will be a few tens of nanometers or possibly much less. The process can then be repeated for the source/drain extension formation 28 (either using an increased impurity concentration or counter-doping) with a similarly sharp gradient resulting. As will be understood by those skilled in the art, these implant and anneal processes must generally be performed separately for NFET and PFET devices (although some combination is possible where counterdoping is employed) by the use of block-out masks or other known techniques.

As alluded to above, this point in the process is preferred for formation of silicide contacts by the deposition of metal and annealing to develop silicide. The anneal process can be combined with the final drive-in and activation anneal of the halo and/or extension impurity structures. Further, the above implantation processes can be more readily controlled to develop the desired impurity distribution profile in the polysilicon 28 if performed prior to metal deposition/silicide formation and is preferred for that reason.

Figure 3:
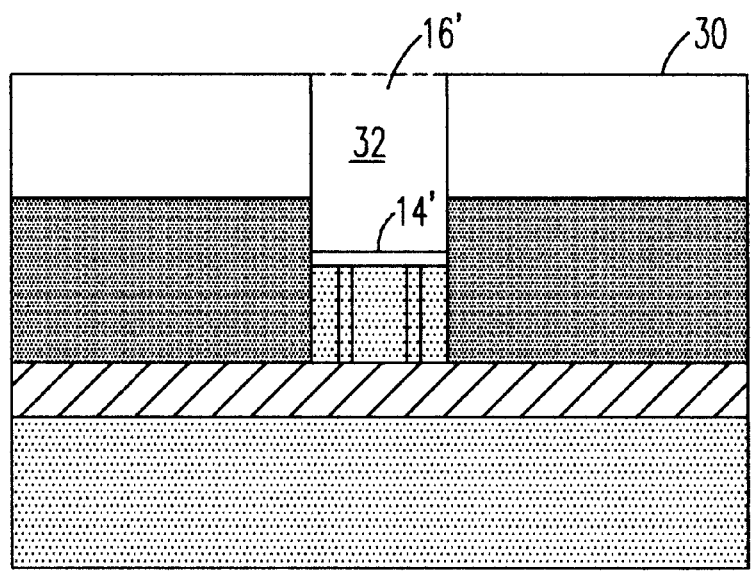
Figure 4:
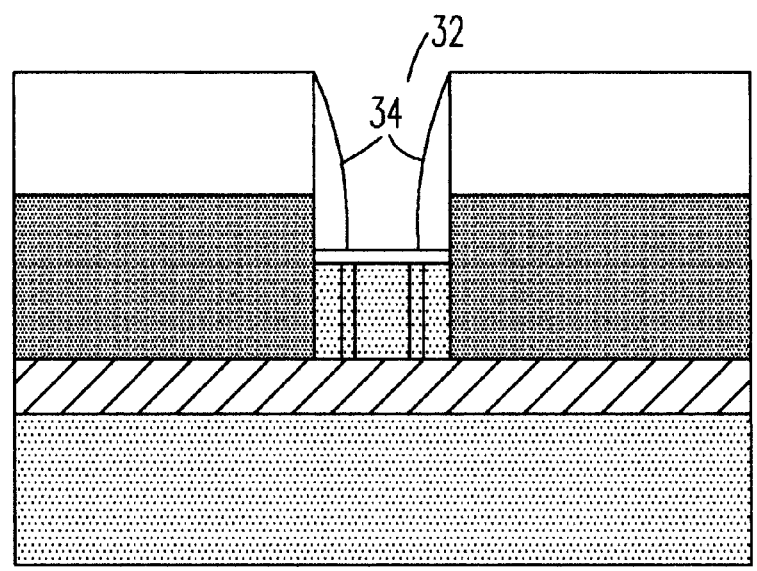

Referring now to FIG. 3, a thick layer of oxide 30 of about 120 nm in thickness is now deposited and planarized back to the surface of the nitride stud 16' by CMP. The nitride can now be removed, selective to the oxide, as alluded to above, by a wet or dry etch, stopping on oxide 14'. Then, as shown in FIG. 4, spacers 34 are formed, preferably of silicon nitride, on the inner walls of the recess 32, from which the nitride stud 16' has been removed, by an isotropic/conformal deposition followed by an anisotropic etch, as is well understood in the art. The thickness of the isotropically deposited layer should be determined from the length of the diffusion of the extension impurity structure and the halo impurity structure so that the spacer terminates on oxide 14' between them or approximately at the location of the end of the extension impurity structure such that the extension structure is adjacent to or extends slightly under the gate region as finally formed.

To develop a high quality gate oxide and to clean the surface of the conduction channel fully, the portion of pad oxide 14' between spacers 34 is removed anisotropically, preferably by a low energy RIE or chemical oxide removal. An anisotropic process limits further effects on spacers 34. The portion of pad oxide 14' is then replaced by a gate oxide or high dielectric constant material layer 36.

Figure 5:
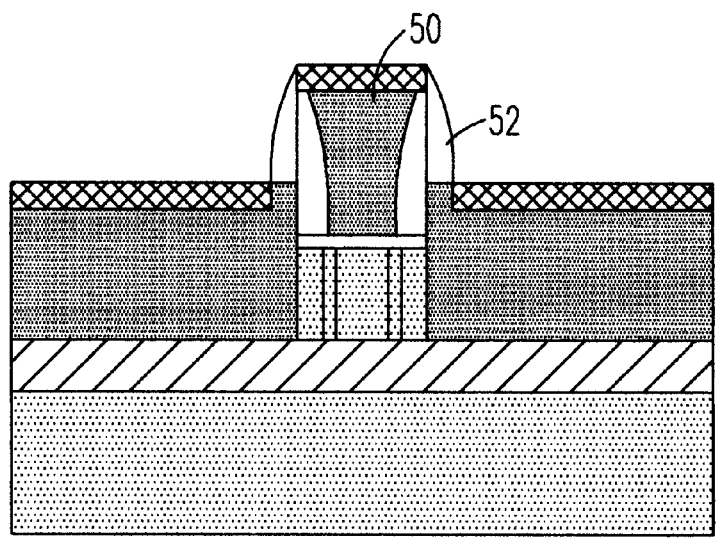
FIG. 5 shows a substantially completed transistor on SOI in accordance with the invention.

Then, as shown in FIG. 5, the gate conductor 50 of polysilicon or metal can be deposited in a layer and planarized to the top of nitride sidewall 34 (using the nitride sidewall as a polish stop) by CMP followed by removal of oxide 30 by any known technique and formation of spacers 52. The gate, if of polysilicon, can then receive an impurity implantation and an anneal process. It should be noted that a suitable temperature for heat treatment of the implanted gate impurity can be achieved without compromise of the halo and extension implant gradients because of the insulation provided by the spacers 34 and 52 as well as the fact that the implanted polysilicon remains available as an impurity source for maintaining the steep impurity concentration gradients.

In fact, it may be desirable for the locations of the halo and extension implants to be shifted somewhat during this process since the steep concentration gradients will be maintained by the diffusion of impurities along the grain boundaries as described above. Similarly, annealing for silicide formation on a polysilicon gate can be performed in accordance with a relatively wide process window because of the diffusion from a polysilicon source that maintains steep impurity concentration gradients. The transistor can then be completed by contact formation.

Referring now to FIGS. 6–10, application of the invention to a double SOI wafer or chip will be discussed. In the double SOI embodiment, a ground plane structure is formed which regulates the electric fields in the conduction channel directly below the transistor gate. Therefore, conduction properties, particularly to develop a large resistance differential between "on" and "off" states at low gate voltages (required by reduced gate dielectric thickness) comparable to dual gate transistors having gates on opposite sides of the conduction channel can be achieved. It should be appreciated in the following discussion that each of FIGS. 6–10 correspond to one of FIGS. 1–5, respectively. Therefore, much of the above discussion of FIGS. 1–5 will apply directly to one of the corresponding FIGS. 6–10 and need not be repeated. For convenience, all reference numerals in FIGS. 6–10 which directly correspond to structures in FIGS. 1–5 will be maintained.

Figure 6:
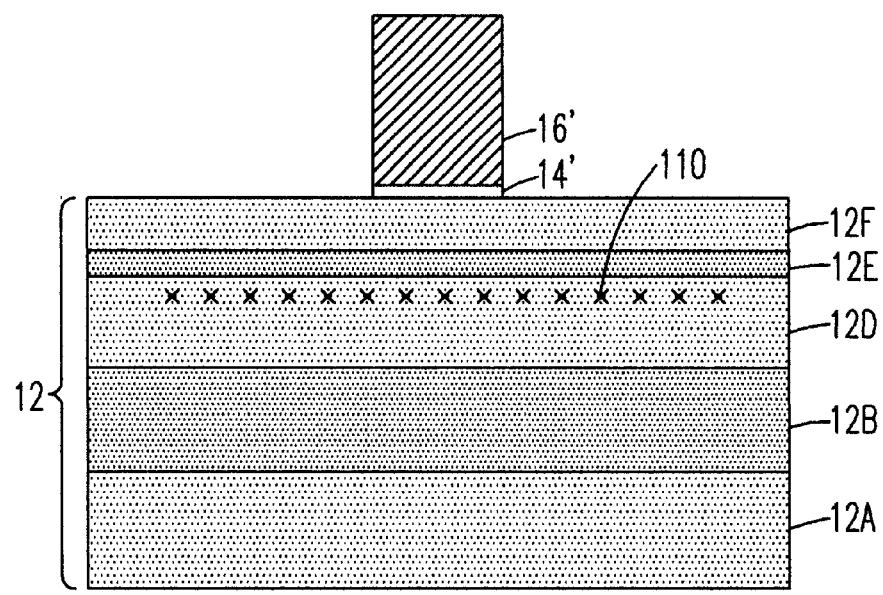
FIG. 6 is a cross-sectional view of an initial stage of fabrication of a transistor on double SOI in accordance with the invention.

In this case, as shown in FIG. 6, wafer or chip 12 is comprised of five layers including a bulk or handling layer 12a and bottom or buried oxide 12b, as before. However, instead of a single SOI layer 12c, a thick bottom SOI layer 12d and a top SOI layer 12f are provided, separated by a back oxide 12e. The wafer can be initially formed as shown or the structure developed from a "single" SOI wafer by generating the buried oxide by an oxygen implant and anneal process which is, itself, well-understood in the art and referred to as a SIMOX process. A similar process could be used to generate the back oxide 12e, as well (using lower implant energies of 10–50 KeV, doses between $5 \times 10^{16}/cm^2$ and $10^{17}/cm^2$ and substrate temperatures between 350° C. and 550° C. followed by a high temperature anneal). Ground plane doping 110 is then performed by implantation into the upper region of the bottom SOI layer followed by a further annealing process to activate the impurity. Then, the patterned pad oxide 14' and nitride stud 16' are formed as described above.

Figure 7:
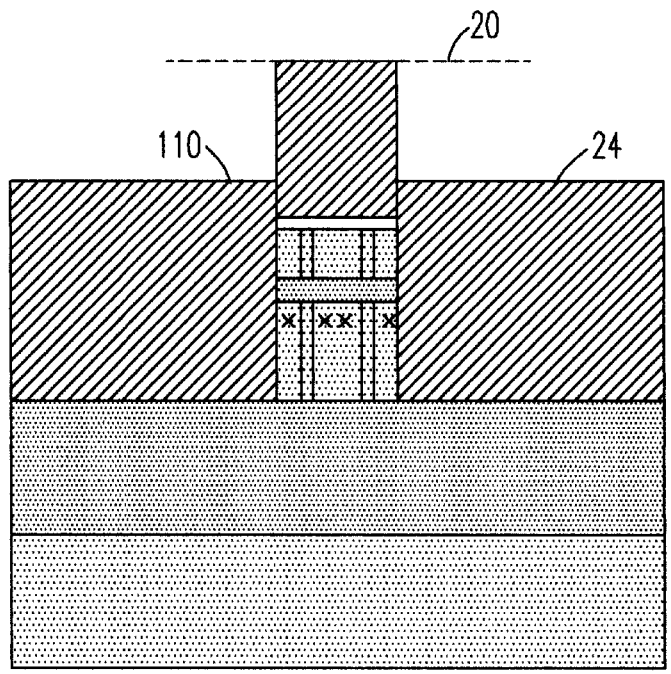
FIGS. 7, 8 and 9 show intermediate stages in the formation of a transistor on double SOI in accordance with the invention.

Referring t FIG. 7, both the top and bottom SOI layers 12d, 12f and the intervening back oxide 12e are etched through o at least into the bottom SOI layer 12d and polysilicon is deposited, planarized and recessed, as before (e.g. 100 nm deep) by RIE selective to nitride. It may be desirable to form this recess to close to the level of oxide 14' to limit the thickness of recessed polysilicon 24 as much as possible without exposing oxide 14' to the etch since it is considered particularly desirable (but not critical) in this embodiment of the invention to achieve a substantially uniform impurity concentration over the thickness of the polysilicon.

As above, if silicide source/drain contacts are to be provided, they may be provided at this stage or after the halo and/or extension implants in the manner described above Again, thermal treatment for alloying metal with polysilicon cannot compromise impurity distribution gradients which have not been developed and are not of importance to the device performance but deposition through metal or silicide may present process difficulties. Further diffusion of the ground plane implant is generally beneficial or can be carried out simultaneously with the silicidation anneal.

The impurity implantations and drive in anneal processes are performed as described above in connection with FIG. 2. However, in this case, impurities are similarly driven into both top and bottom SOI layers 12d and 12f, respectively. The impurity concentration gradients will be very steep, as before, and for halo and extension impurity structures in the remaining portion of the top SOT layer 12f but, in the bottom SOI layer 12d will form a ground plane in combination wit the ground plane implantation 110 described above in the upper portion of the bottom SOI layer 12d.

This additional impurity concentration assures that the upper portion of the bottom SOI layer will be sufficiently conductive to function as a ground plane to regulate the electric field in the upper conduction channel and improve the control which can be achieved with low voltages on the gate electrode. The ground plane effectively shields the conduction channel from the fields orignating from the source and drain. The extension implants and ground plane implants are of opposite conductivity type forming diodes to prevent the ground plane from shunting the conduction channel even though the lower silicon layer 12d contacts the source/drain regions.

Figure 8:
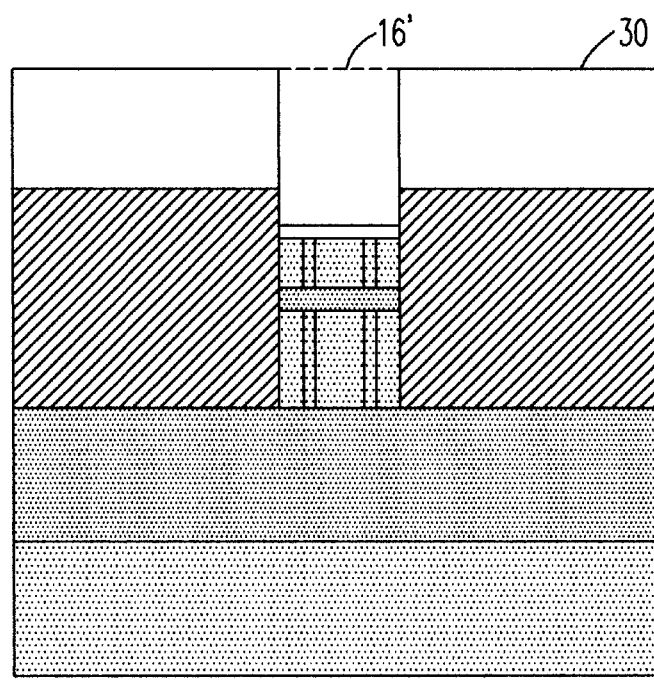
Figure 9:
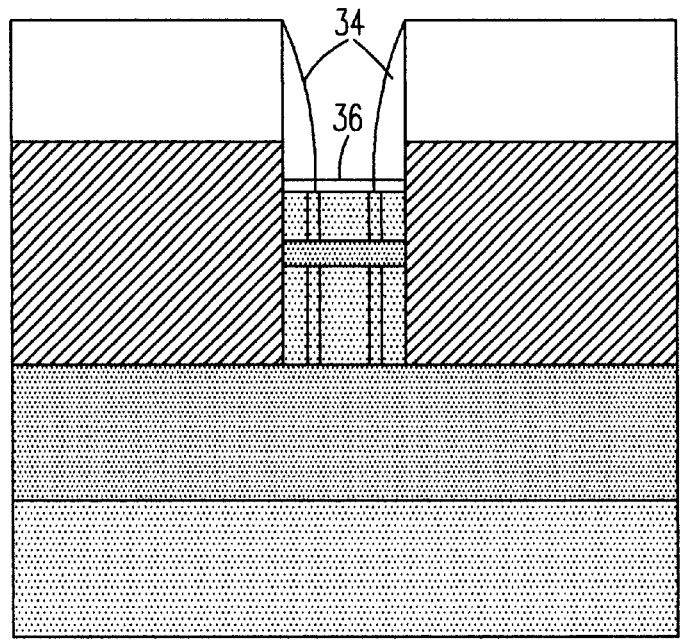
Figure 10:
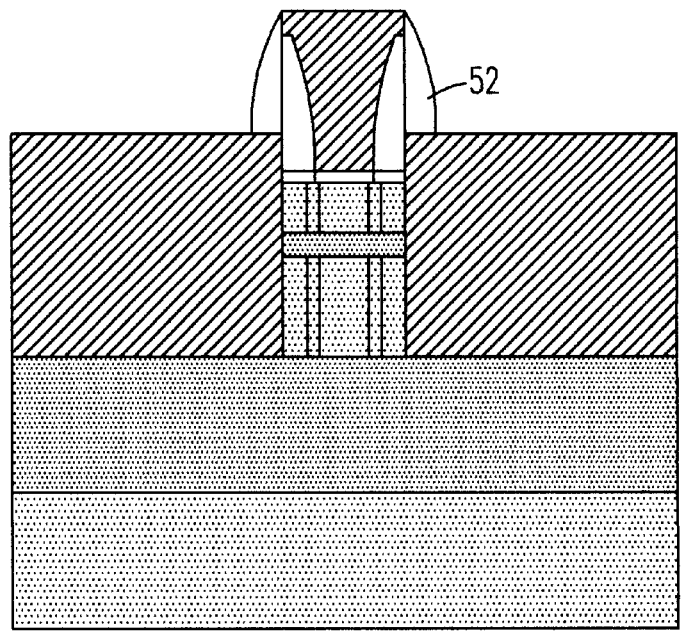
FIG. 10 shows a substantially completed transistor on double SOI in accordance with the invention.

FIGS. 8, 9 and 10 precisely follow the process described above in connection with FIGS. 3, 4 and 5. Oxide layer 30 is deposited, nitride stud 16' is removed and sidewalls 34 are formed in the recess. A portion of pad oxide 14' is removed and a gate insulator 36 formed followed by the gate electrode deposition and doping, if necessary, removal of oxide 30, and formation of sidewalls 52.

In view of the foregoing, it is seen that the use of polysilicon as a diffusion source into monocrystalline silicon provides steep impurity concentration gradients that form structures avoiding or severely limiting development of undesirable short channel effects in field effect transistors, particularly when formed at very small size and even where the transistor conduction channel is reduced to less than minimum lithographic feature size. The method by which such structures may be achieved is, in several respects, simplified from other techniques employed to for transistors at high integration density but which have not been able to support high transistor performance at presently possible transistor sizes, as is realized by the present invention. Further, at current and foreseeable minimum feature sizes, the invention provides scaling of halo and extension impurity structures not previously possible.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming a field effect transistor semiconductor device including steps of forming a recess in a monocrystalline layer on an insulator and adjacent a stud defining a transistor location, depositing polycrystalline material in said recess, implanting a impurity in said polycrystalline material, diffusing said impurity along grain boundaries in said polycrystalline material and into said monocrystalline material to a controlled distance removing said stud to form another recess, depositing sidewalls in said another recess having a thickness corresponding to said controlled distance, and forming a gate of said field effect transistors between said sidewalls.

2. A method as recited in claim 1 wherein said step of forming a recess includes recessing of a top monocrystalline layer, a bottom monocrystalline layer and an intervening back oxide layer.

3. A method as recited in claim 2 including a further step of providing impurities in a region of said bottom monocrystalline layer to form a ground plane.

4. A method as recited in claim 1, wherein said monocrystalline material is silicon and said polycrystalline material is polysilicon.

5. A method as recited in claim 1, wherein said implanting and diffusing steps form a halo impurity structure.

6. A method as recited in claim 1, wherein said implanting and diffusing steps form an extension impurity structure.

7. A method as recited in claim 5, wherein said implanting and diffusing steps are repeated to form an extension impurity structure adjacent said halo impurity structure.

8. A method as recited in claim 3, wherein said implanting and diffusing steps form a halo impurity structure.

9. A method as recited in claim 3, wherein said implanting and diffusing steps form an extension impurity structure.

10. A method as recited in claim 8, wherein said implanting and diffusing steps are repeated to form an extension impurity structure adjacent said halo impurity structure.

* * * * *